United States Patent [19]
Hollenbeck et al.

[11] Patent Number: 5,410,581
[45] Date of Patent: Apr. 25, 1995

[54] APPARATUS AND METHOD FOR DETERMINING A TIME THAT A SYSTEM'S MAIN POWER WAS INACTIVE

[75] Inventors: Neal W. Hollenbeck; David D. Kang, both of Schaumburg, Ill.

[73] Assignee: Motorola, Inc., Schaumburg, Ill.

[21] Appl. No.: 236,850

[22] Filed: May 2, 1994

[51] Int. Cl.[6] .......................................... H03K 21/40
[52] U.S. Cl. ........................................ 377/28; 377/16; 327/1
[58] Field of Search ................... 377/28, 16; 328/129.1

[56] References Cited

U.S. PATENT DOCUMENTS 4,584,651 4/1986 Carey, Jr. et al. .................... 377/16

OTHER PUBLICATIONS

IBM Tech Disc. Bul. "Self-clearing status register" vol. 30, No. 6, Nov. 1987.

*Primary Examiner*—Margaret R. Wambach
*Attorney, Agent, or Firm*—Nicholas C. Hopman

[57] ABSTRACT

An apparatus and method for determining a time that a system's main power was inactive includes a counter circuit (171) for accumulating transitions of a clock signal (149) while the system's main power (117) is inactive. Preferably, another circuit (159, 125) determines a periodicity of the clock signal (149) after the system's main power (117) transitions active. Then a computational circuit, preferably a microcontroller (129), determines the time (183) that the system's main power (117) was inactive dependent on a number of transitions of the clock signal (149) accumulated by the counter circuit (171) when the system's main power (119) was inactive and the determined periodicity of the clock signal (149) after the system's main power (117) transitions active. Preferably, this apparatus and method are used in a vehicle to determine how long a time that an engine is turned off and to modify an engine control strategy dependent on that determined time.

20 Claims, 2 Drawing Sheets

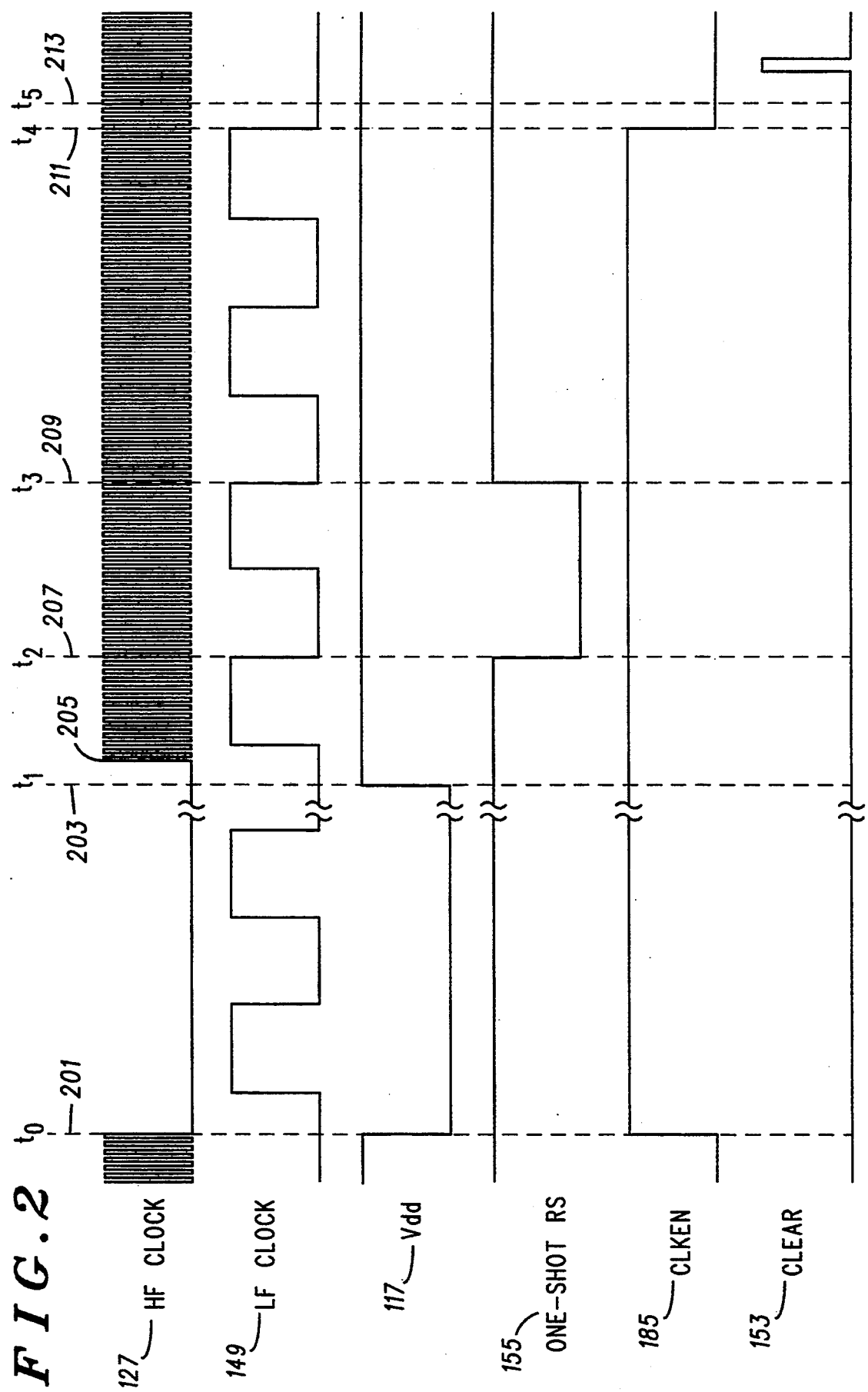

APPARATUS AND METHOD FOR DETERMINING A TIME THAT A SYSTEM'S MAIN POWER WAS INACTIVE

FIELD OF THE INVENTION

This invention is generally directed to the field of electronic control systems, and specifically useful for determining a time that a system's main power was inactive.

BACKGROUND OF THE INVENTION

In a class of electronic control systems it is often necessary to determine how long of a time that a system's main power was off. In particular, electronic control systems, used in automotive engine control applications, need to know how long an engine was off. In an engine control this is important because the engine can function differently dependent on how long a time that the engine was inactive. In particular, given stricter emissions regulations, a fuel control strategy executing in the engine control is preferably modified dependent on an estimated amount of fuel fumes remaining in the engine after the engine is inactive. The amount of fuel fumes remaining in the engine after the engine is inactive can be estimated by knowing how long of a time that the engine was off, or inactive. Typically, this inactive time is measured when the engine's ignition keyswitch is off and is referred to as a key-off time.

Since an engine can only run with main power applied to the engine control through the ignition keyswitch, knowing how long of a time that the system's main power was off or inactive will be indicative of how long a time that the engine was inactive or off.

Once the system's main power inactive time is determined, the fuel control strategy can be altered dependent on this key-off time. A typical strategy would be to add less fuel to a starting sequence if the engine was only off for a short time. This action will prevent emission of excess unburned fuel during the engine starting sequence.

In an automotive operating environment, the ignition keyswitch key-off time must be measured accurately over a several hour period. This must be done while imposing a very small current drain from a vehicle's battery so as not to drain it excessively. At the same time the solution must be mechanically robust to survive the extreme range of operating temperatures, shock, and vibration characteristic of an automotive operating environment.

In general, prior art schemes can be categorized into two approaches. A first approach relies on a relatively low current drain time keeping approach using a low frequency time base circuit comprised of a crystal resonator driving a binary counter. While the ignition keyswitch is off the crystal resonator and counter are powered by a keep-alive power source. During the time the ignition keyswitch is off, the binary counter accumulates transitions of a signal provided by the crystal resonator. When the ignition keyswitch is turned on the counter value is interpreted by the engine control's microcontroller and the key-off time is determined. A problem with this approach is that the crystal resonator is a relatively fragile device. Because of this it is difficult to reliably mount the crystal resonator in an engine control module.

A second prior art scheme relies on a relatively high current drain but more accurate time-keeping scheme. In this scheme a high-frequency quartz crystal replaces the crystal resonator. Although this approach has sufficient accuracy it also is difficult to reliably mount the quartz crystal in an engine control module. Furthermore, this approach requires much more current drain from the keep-alive power source making it an unattractive solution.

Additionally, both approaches are relatively expensive and require a significant amount of physical space in engine control modules that are required to be physically smaller and smaller.

What is needed is an improved apparatus and method that is more physically compact, reliable, economical, and is more manufacturable.

BRIEF DESCRIPTION OF THE DRAWINGS

FIG. 2 illustrates various waveforms associated with the operation of the schematic block diagram shown in FIG. 1.

DETAILED DESCRIPTION OF A PREFERRED EMBODIMENT

Figure 1:
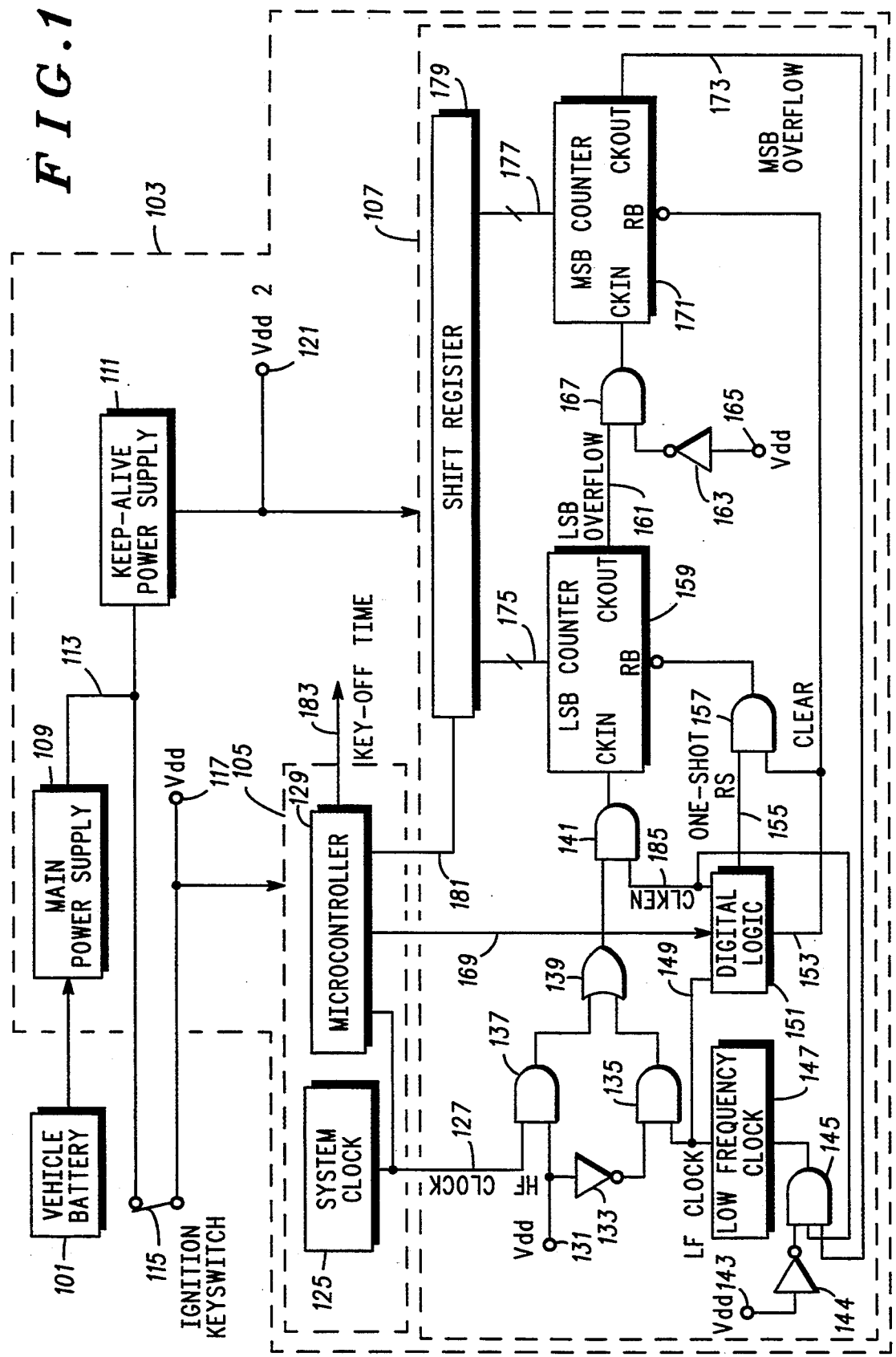
FIG. 1 shows a schematic block diagram in accordance with a preferred embodiment of the invention.

An apparatus and method for determining a time that a system's main power was inactive includes a relatively low power consumption clock source that as a negative virtue of its relatively low power consumption architecture provides a relatively inaccurate clock signal to a first relatively low power consumption counter circuit while the system's main power is off. The first relatively low power consumption counter circuit accumulates transitions of the clock signal as long as the system's main power is off. When the system's main power gets activated a relatively high accuracy clock source that as a negative virtue of its relatively high power consumption is used to measure the periodicity of the relatively low power consumption relatively inaccurate clock source. The measured periodicity and the number of transitions accumulated in the first counter are used to determine the time that the system's main power was off. This approach has a distinct advantage over prior art schemes because it achieves the relatively high accuracy required while operating at a relatively low power consumption required during the time that the system's main power is inactivated.

In a preferred embodiment this technique is applied in an engine control for determining how long a time that an engine was off. Given this information the engine control's strategy can be altered if desired. One application includes the alteration of a fuel control strategy dependent on the time the engine was off. FIG. 1 shows details of the system. FIG. 2 illustrates various waveforms associated with the operation of the schematic block diagram shown in FIG. 1. In the following operational example both FIG. 1 and FIG. 2 will be referred to.

In FIG. 1 a schematic block diagram illustrates the preferred embodiment of an apparatus for determining the time that an engine control's main power was inactive—thus the corresponding engine was off. An engine control 103 is powered by a vehicle battery 101. The vehicle battery 101 powers a main power supply 109 that in turn powers an external ignition keyswitch 115, and also a keep-alive power supply 111. If the ignition keyswitch 115 is activated, as shown in FIG. 1, the main power supply 109 supplies power 113 to the system's main power terminal Vdd 117. Note that the system's main power terminal 117 is connected in common with terminals 143, 165 and 131. When the system's main power terminal Vdd 117 is powered it provides power to a relatively high power consumption portion 105 of the engine control 103. The relatively high power consumption portion 105 of the engine control 103 is used to run the engine. When the engine is running the relatively high power consumption of the circuit 105 can be supported through an alternator based charging system. When the engine is not running the power consumption of the overall engine control 103 must be kept to a minimum to ensure that the battery 101 does not appreciably discharge.

Typically, activation of the ignition keyswitch 115 is accomplished by the use of a mechanical key. Independent of the state of the ignition keyswitch 115, the keep-alive power supply 111 provides keep-alive power Vdd2 121 to a relatively low power consumption portion 107 of the engine control 103. Preferably, this relatively low power consumption portion 107 is integrated onto a low power consumption demand integrated circuit. The relatively low power consumption portion 107 of the engine control 103 is powered when the ignition keyswitch 115 is in the inactive state to enable determination of the time that the engine is off.

In operation, when the ignition keyswitch 115 is turned off—in this case opened, the system's main power at Vdd terminal 117 is removed from the relatively high power consumption portion 105 of the engine control 103. Also, a CLKEN (clock enable) signal 185 is generated by a digital logic circuit 151 when the system's main power at Vdd terminal 117 transitions inactive. Note that the digital logic circuit 151 is constructed of conventional gates and the details of its construction are not described here because those of average skill in the art could construct many different logic circuits dependent on the description of the behavior of the circuit as described thoroughly herein. The generation of the CLKEN signal 185 by the digital logic circuit 151 is shown in FIG. 2 at reference number 201 at time reference line $t_0$. Responsive to the provision of the CLKEN signal 185 a first, low frequency, clock circuit 147 generates a first (low-frequency) LF clock signal 149. A waveform representing the LF clock signal 149 is shown in FIG. 2 at reference number 201 at time reference line $t_0$. The LF clock signal 149 represents the above mentioned clock signal that is used to keep time when the ignition keyswitch 115 is off and the system's main power at Vdd terminal 117 is inactive. As long as the system's main power at Vdd terminal 117 is inactive, and for a short time after system's main power at Vdd terminal 117 transitions active this LF clock signal 149 is provided by the low frequency clock circuit 147. Note that the time that the ignition keyswitch 115 is in the inactive or open state and the system's main power at Vdd terminal 117 is inactive is referred to as the key-off time.

In the preferred embodiment the low frequency clock circuit 147 includes integral monolithic frequency determining components. These components include a resistive element and a capacitive element both integrated directly onto the integrated circuit hosting the relatively low power consumption portion 107 of the engine control 103. The resistive and capacitive elements are connected to form a relaxation oscillator. As mentioned earlier, this particular architecture for the low frequency clock circuit 147 enjoys a relatively low power consumption. However, choosing this architecture has a negative side-effect—that of providing a relatively inaccurate clock signal. This inaccuracy is due primarily to the initial inaccuracies associated with process variation in constructing monolithic resistors and capacitors to form the relaxation oscillator. Later, a mechanism will be described to correct this inherent inaccuracy. To keep track of the key-off time an LSB counter 159 accumulates transitions of the LF clock signal 149. In turn an MSB (most significant bits) counter 171 is clocked by an LSB (least significant bits) overflow signal 161 provided at an output of the LSB counter when the LSB counter ripples through the LF clock signal 149. In the preferred embodiment the MSB counter 171 will retain the significant indication of key-off time and the LSB counter will be re-used to measure the periodicity of the LF clock signal 149 and is used when the system's main power at Vdd terminal 117 is inactive principally as a prescalar to the MSB counter 171. In the preferred embodiment the frequency of the LF clock signal is 284 kHz. Given this and a 7 bit LSB counter 159 and a 28 bit MSB counter 171, a total key-off time of about 16 hours can be accumulated with a resolution of about 450 microseconds. This relationship is ensured by the following equation.

EQUATION 1 maximum measurable key-off time =
LF clock signal period$\cdot 2^{LSB\ counter\ order} \cdot 2^{MSB\ counter\ order}$ or:

16 hours $\approx 1/284$ kHz$\cdot 2^7 \cdot 2^{(28-1)}$

The resolution of the measurement is determined by the order of the LSB counter and can be represented by the following deterministic equation.

EQUATION 2 key-off time measurement resolution = LF clock signal period$\cdot 2^{LSB\ counter\ order}$ or:

450 microseconds $\approx 1/284$ kHz$\cdot 2^7$

A gate structure including a logical AND gate 141, a logical OR gate 139 and a logical AND gate 135 is used to gate the LF clock signal 149 to the LSB counter 159 when the CLKEN signal 185 is active. A gate structure including a logical inverter 163 and a logical AND gate 167 ensures that the LSB overflow signal 161 only clocks the MSB counter 171 when the system's main power Vdd, here shown at reference number 165 is off. This enables the retention of the transitions of the LF clock signal 149 scaled by the LSB counter 159. Another logical AND gate 145, responsive to an overflow of the MSB counter 171 as indicated by the MSB overflow signal 173, in combination with the absence of the system's main power, here shown at reference number 143 and inverted by the logical inverter 144, is used to gate off the LF clock signal 149. This stops the LSB counter 159 and the MSB counter 171 from counting. The purpose of this structure is to shut down the power consumption associated with the low frequency clock circuit 147. Note that the LSB counter 159 and the MSB counter 171 are constructed of binary ripple counters and the LSB overflow signal 161 and the MSB overflow signal 173 are essentially the highest order bit of each counter.

Later, at reference number 201 at time reference line $t_1$ the system's main power at Vdd terminal 117 transitions active responsive to an activation—here a closing of the ignition keyswitch 115. When the system's main power at Vdd terminal 117 transitions active the LSB overflow signal 161 is no longer provided to the MSB counter 171. This is ensured by a structure including the Vdd terminal 165, the logical inverter 163, and the logical AND gate 167. Because of this gating off of the LSB overflow signal 161 the MSB counter 171 will retain the accumulated transitions of the scaled LF clock signal. The accumulated transitions are available in a parallel binary form at reference number 177 and represent the number of LF clock signal 149 transitions scaled by the order of the LSB counter 159 while the system's main power was off- or in-effect while the ignition keyswitch 115 was off. Later, this information will be used by a microcontroller 129 to determine how long a time that the ignition key keyswitch 115 was turned off.

A short time after the system's main power at Vdd terminal 117 transitions active, as shown at reference number 203 at time reference line $t_1$, a second, relatively high frequency, system clock 125 provides a second (high-frequency) HF clock signal 127. A waveform representing provision of the HF clock signal 127 is shown in FIG. 2 at reference number 205. Note that is provided at a time slightly delayed from time reference time reference line $t_1$ because it takes a little time for the system clock 125 to startup. In the preferred embodiment a quartz crystal based circuit is used by the system clock to derive the HF clock signal 127. As mentioned earlier this architecture affords a very frequency accurate and frequency stable reference. The HF clock signal 127 is used by the relatively low power consumption portion 107 to determine a periodicity of the LF clock signal 149 after the system's main power transitions active and also to clock the microcontroller 129.

To determine a periodicity of the LF clock signal 149 the HF clock signal 127 is gated into the LSB counter for a certain period of the LF clock signal 149. In-effect the periodicity of the LF clock signal 149 will be measured by the highly frequency stable and accurate HF clock signal 127. That the architecture of the high frequency system clock 125 requires a relatively high power consumption is irrelevant here because the main system power is now supplemented by the above-mentioned alternator based charging system—thus the vehicle battery 101 is not being unnecessarily drained.

Before the LSB counter 159 is allowed to accumulate transitions of the HF clock signal 127 the LSB counter 159 must be cleared—here reset to eliminate any accumulation of LF clock 149 transitions when the LSB counter 159 was being used as a prescaler. The digital logic circuit 151 ensures this resetting of the LSB counter 159 by issuing a one-shot RS signal 155. A waveform representing the one-shot RS signal 155 is shown in FIG. 2 at reference number 155. At reference number 207, time reference 12 the one-shot RS signal 155 transitions to a logical zero state. While the one-shot RS signal 155 is in the logical zero state the LSB counter 159 is held reset. When the one-shot RS signal 155 transitions to a logical one state, shown here at reference number 209, time reference 13 the LSB counter 159 commences accumulation of transitions of the HF clock signal 127.

The digital logic circuit 151 is constructed such that the CLKEN signal 185 is provided until reference number 211 shown at time reference $t_5$ where the CLKEN signal 185 transitions inactive. When the CLKEN signal 185 transitions inactive the logical AND gate 141 prevents the provision of the HF clock signal 127 to the LSB counter 159. While the CLKEN signal 185 remains active transitions of the HF clock signal 127 will be accumulated in the LSB counter 159. In the preferred embodiment, an integer multiple number of LF clock 149 signal periods is used to determine the length and termination of the CLKEN signal 185. Preferably, multiple periods of the LF clock signal 149 are used to ensure that quantization error is minimized associated with quantizing the HF clock signal 127 in this manner. Of course different periodicities of the LF clock signal 149 could be programmed into the structure of the digital logic circuit 151.

When the CLKEN signal 185 transitions inactive, the LSB counter will hold a number of HF clock 127 signals corresponding to two full periods of the LF clock signal. The accumulated transitions of the HF clock signal 127 during the two periods of the LF clock signal 149 are available in a parallel binary form at reference number 175 and represent the number of HF clock signal 127 transitions during the two periods of the LF clock signal 149.

A pre-determined time after the system's main power at Vdd terminal 117 transitions active the microcontroller 129 will read the values 175 and 177 provided by the LSB counter 159 and the MSB counter 171. This read operation is shown to occur at reference number 213 shown at time reference $t_4$ in FIG. 2. This read operation is accomplished through the use of a shift register 179 which conveniently transfers the contents of the LSB counter 159 and the MSB counter 171 using a serial data stream 169. In the preferred embodiment, a serial data stream was used to minimize pin count from the integrated circuit associated with the low power consumption portion 107 of the engine control 103, and the microcontroller 129.

After the microcontroller has read the content of the LSB counter 159 and the MSB counter 171, it clears the LSB counter 159 and the MSB counter 171 to prepare them for counting from a known state when Vdd 117 again transitions inactive responsive to opening of the ignition keyswitch 115. This is clear operation is accomplished by sending a counter clear signal 169 from the microcontroller 129 to the digital logic circuit 15 1 which in turn generates a clear signal 153 which is coupled to the LSB counter 159 and the MSB counter 171. A waveform representing the clear signal 153 is shown in FIG. 2 at reference number 153.

After the microcontroller 129 has acquisitioned the values in the LSB counter 159 and the MSB counter 171, using a conventional software procedure, the microcontroller 129 preferably multiplies the value of the LSB counter 159, representative of the periodicity of the LF clock signal 149 in terms of the accumulated transitions of the HF clock signal 127, by the value of the MSB counter 171, representative of the number of LF clock signal 149 transitions scaled by the order of the LSB counter 159 while the system's main power was off. The result is a variable representative of key-off time and can optionally be provided externally as shown in FIG. 1 at reference number 183. Alternatively, a function other than a multiplication can be used to combine the two factors 175 and 177.

In conclusion an improved apparatus and method have been described for determining a time that a system's main power was turned off. This approach is more physically compact, reliable, economical, and is more manufacturable than prior art schemes. Physical compactness is achieved through integration of the low power consumption circuits onto an integrated circuit and also by the serial architecture of the serial data stream 181. Furthermore, this approach is more reliable than prior art schemes because the frequency determining components for the low frequency clock circuit 147 are integrated directly onto the integrated circuit rather than using external components. This architecture is more economical, compact and manufacturable. Additionally, power consumption is further reduced through the action of powering down the low frequency clock circuit 147 when the MSB counter 171 overflows.

What is claimed is:

1. An apparatus for determining a time that a system's main power was inactive comprising:
    clock means for providing a clock signal while the system's main power is inactive, wherein the clock signal has transitions;
    means for accumulating the transitions of the clock signal while the system's main power is inactive;
    means for determining a periodicity of the clock signal after the system's main power transitions active; and
    means for determining the time the system's main power was inactive dependent on a number of accumulated transitions of the clock signal when the system's main power was inactive and the determined periodicity of the clock signal after the system's main power transitions active.

2. An apparatus in accordance with claim 1 wherein the means for determining comprises means for determining the time the system's main power was inactive by multiplying the number of accumulated transitions of the clock signal when the system's main power was inactive by the determined periodicity of the clock signal after the system's main power transitions active.

3. An apparatus in accordance with claim 1 wherein the means for determining comprises means for determining the periodicity of the clock signal by determining an average periodicity dependent on more than one period of the clock signal.

4. An apparatus in accordance with claim 1 wherein the means for determining comprises means for determining a periodicity of the clock signal using a high-frequency system clock signal available after the system's main power transitions active.

5. An apparatus for determining a time that a system's main power was inactive comprising:
    system clock means for providing a high-frequency clock signal when the system's main power is active;
    low-frequency clock means for providing a low-frequency clock signal independent of the activity of the system's main power;
    first counter means for accumulating transitions of the low-frequency clock signal while the system's main power is inactive;
    second counter means for accumulating transitions of the high-frequency clock signal dependent on a periodicity of the low-frequency clock signal when the system's main power is active; and
    computational means for determining the time the system's main power was inactive dependent on a number of low-frequency clock signal transitions accumulated by the first counter means when the system's main power was inactive and a number of accumulated transitions of the high-frequency clock signal when the system's main power is active.

6. An apparatus in accordance with claim 5 wherein the computational means comprises means for determining the time the system's main power was inactive by multiplying the number of low-frequency clock signal transitions accumulated by the first counter means when the system's main power was inactive by the number of accumulated transitions of the high-frequency clock signal when the system's main power is active.

7. An apparatus in accordance with claim 5 wherein the second counter means further comprises means for accumulating transitions of the high-frequency clock signal dependent on an integer multiple number of periods of the low-frequency clock signal when the system's main power is active.

8. An apparatus in accordance with claim 5 further comprising means for resetting the first counter means when the system's main power transitions from active to inactive.

9. An apparatus in accordance with claim 5 wherein the first counter means further comprises means for preventing the accumulation of transitions of the low-frequency clock signal when the first counter means has overflowed.

10. An apparatus for determining a time that a system's main power was inactive comprising:
    a system clock for providing a high-frequency clock signal when the system's main power is active;
    a low-frequency clock for providing a low-frequency clock signal independent of the activity of the system's main power;
    an LSB counter for accumulating transitions of the low-frequency clock signal while the system's main power is inactive and for providing an LSB overflow signal when the LSB counter overflows, and for accumulating transitions of the high-frequency clock signal when the system's main power is active;
    an MSB counter for accumulating transitions of the LSB counter overflow signal when the system's main power was inactive; and
    a computational circuit for determining the time the system's main power was inactive dependent on a number of LSB overflow signal transitions accumulated by the MSB counter when the system's main power was inactive and a number of transitions of the high-frequency clock signal accumulated in the LSB counter when the system's main power is active.

11. An apparatus in accordance with claim 10 wherein the computational means comprises means for determining the time the system's main power was inactive by multiplying the number of LSB overflow signal transitions accumulated by the MSB counter when the system's main power was inactive by a number of transitions of the high-frequency clock signal accumulated in the LSB counter when the system's main power is active.

12. An apparatus in accordance with claim 11 wherein the LSB counter further comprises a logic circuit causing accumulation of transitions of the high-frequency clock signal dependent on an integer multiple number of periods of the LSB overflow signal when the system's main power is active.

13. An apparatus in accordance with claim 12 wherein the MSB counter further comprises a circuit for preventing the accumulation of transitions of the LSB overflow signal when the MSB counter has overflowed.

14. An apparatus in accordance with claim 13 further comprising means for resetting the LSB counter after the time the system's main power was inactive was determined.

15. A method of determining a time that a system's main power was inactive comprising the steps of:
providing a clock signal while the system's main power is inactive, wherein the clock signal has transitions;
accumulating the transitions of the clock signal while the system's main power is inactive;
determining a periodicity of the clock signal after the system's main power transitions active; and
determining the time the system's main power was inactive dependent on a number of accumulated transitions of the clock signal when the system's main power was inactive and the determined periodicity of the clock signal after the system's main power transitions active.

16. A method in accordance with claim 15 wherein the step of providing comprises determining the time the system's main power was inactive by multiplying the number of accumulated transitions of the clock signal when the system's main power was inactive by the determined periodicity of the clock signal after the system's main power transitions active.

17. A method in accordance with claim 15 wherein the step of determining a periodicity of the clock signal comprises determining the periodicity of the clock signal by determining an average periodicity dependent on more than one period of the clock signal.

18. A method in accordance with claim 15 wherein the step of determining comprises determining a periodicity of the clock signal using a high-frequency system clock signal available after the system's main power transitions active.

19. A system for determining a key-off time of a vehicle, said system comprising:
keyswitch means for providing power when a to be provided key positions the keyswitch means in an active state, and for ceasing provision of power when the key positions the keyswitch means in an inactive state;
means for accumulating transitions of a clock signal when the power is not provided;
means for determining a periodicity of the clock signal after the power is provided; and
means for determining the time the system's power was in the inactive state dependent on a number of accumulated transitions of the clock signal when the system's power was the inactive state and the determined periodicity of the clock signal when the system's power is in the active state.

20. A method of determining off-time of a system's main power comprising the steps of:
providing a first clock signal from a first clock signal source, wherein a frequency accuracy of the first signal is relatively low;
providing a second clock signal from a second clock signal source, wherein the frequency accuracy of the second clock signal is higher than the accuracy of the first clock signal;
counting the first clock signal while the system's main power is off to develop an off-time count indicative of the off-time of the system's main power;
determining a period of the first clock signal dependent on the second clock signal when the system's main power is on; and
determining the off-time of the system's main power dependent on the determined period of the first clock signal and the off-time count.

* * * * *